United States Patent
Madar et al.

(10) Patent No.: US 6,238,739 B1
(45) Date of Patent: May 29, 2001

(54) NON-PLASMA CVD METHOD AND APPARATUS OF FORMING $TI_{1-x}Al_xN$ COATINGS

(75) Inventors: Roland Madar, Eybens; Alain Rouault, Poisat; Elisabeth Blanquet, Grenoble; Claude Bernard, Brie et Angonnes; Anne-Marie Dutron, Grenoble, all of (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 09/125,968

(22) PCT Filed: Feb. 25, 1997

(86) PCT No.: PCT/FR97/00336

§ 371 Date: Feb. 2, 1999

§ 102(e) Date: Feb. 2, 1999

(87) PCT Pub. No.: WO97/32057

PCT Pub. Date: Sep. 4, 1997

(30) Foreign Application Priority Data

Feb. 27, 1996 (FR) .................................................. 96 02699

(51) Int. Cl.$^7$ .................................................. C23C 16/08
(52) U.S. Cl. .............................. 427/255.39; 427/255.391; 427/255.394; 118/719; 118/724
(58) Field of Search ................. 427/255.28, 255.32, 427/255.36, 255.391, 255.394, 255.39; 118/719, 724

(56) References Cited

U.S. PATENT DOCUMENTS

| | | | |
|---|---|---|---|
| 4,842,710 | * | 6/1989 | Freller et al. ......................... 427/569 |
| 5,071,693 | * | 12/1991 | Sue et al. ........................... 427/248.1 |
| 5,252,360 | * | 10/1993 | Huttl et al. ....................... 427/249.19 |
| 5,272,014 | * | 12/1993 | Leyendecker et al. .............. 427/569 |

OTHER PUBLICATIONS

Hakansson, G. et al., "Microstructure and Physical Properties of Polycrystalline Metastable TiO.5AIO.5N Alloys Grown by DC Magnetron Sputter Deposition." Thin Solid Films, 153 (1987) 55–65.*

Lee, Sang–Hyeob et al., "(Ti1–xAlx)N coatings by plasma–enhanced chemical vapor deposition". J. Vac. Sci. Technol., A 12(4), Jul./Aug. 1994, pp. 1602–1607.*

* cited by examiner

*Primary Examiner*—Timothy Meeks
*Assistant Examiner*—Bret Chen
(74) *Attorney, Agent, or Firm*—Arthur L. Plevy; Duane, Morris & Heckscher

(57) ABSTRACT

A method for forming a $Ti_{1-x}Al_xN$ coating on a part without plasma enhancement, wherein a chemical vapor deposition chamber is heated to 250–500° C.; the part to be coated is heated to 550–650° C. and placed in said chamber; and a mixture of titanium and aluminium chlorides, $NH_3$ and $H_2$ is injected into the chamber. The molar amount of $NH_3$ is greater than the molar amount of chlorides, and the molar amount of hydrogen is over five times greater than the molar amount of chlorides.

5 Claims, 1 Drawing Sheet

NON-PLASMA CVD METHOD AND APPARATUS OF FORMING $Ti_{1-x}Al_xN$ COATINGS

FIELD OF THE INVENTION

The present invention relates to the formation of $Ti_{1-x}Al_xN$ type compounds on substrates.

BACKGROUND OF THE INVENTION

The advantages of such coatings are well-known. It is known since a long time that it is particularly useful to deposit TiN layers on parts that have to be surface hardened, for example for coating tools, to increase their resistance to wear. However, it has been noted that TiN layers are liable to deterioration with time due to oxidation. However, the introduction of aluminum in the TiN array provides a good resistance to oxidation because, during use, a thin $Al_2O_3$ layer is formed and protects the hard coating, which largely increases the lifetime of the tool. This result is not obtained by a mixed deposit of TiN and AlN.

Thus, many searches have been made for implementing $Ti_{1-x}Al_xN$ coatings. The known methods are mainly physical deposits such as reactive sputtering, possibly magnetron enhanced, and arc reactive coatings. These methods are not easy to implement, in particular due to the problem of making the sources. Additionally, sputtering type methods or projection type methods are not well adapted to the coating of parts having complex shapes.

Therefore, one has tried to find a deposition method of the CVD type. However, while it is known to make CVD deposition of TiN layers or AlN layers from titanium chloride and aluminum chloride in the presence of ammonia and/or nitrogen, it has always been considered that the simultaneous use of titanium chloride and aluminum chloride will provide mixed depositions of AlN and TiN and not to the deposition of an homogeneous layer of $Ti_{1-x}Al_xN$ type phase.

Additionally, attempts to make CVD coatings from organo-metallic compounds of titanium and aluminum have been unsuccessful up to now.

One will more particularly consider the article of Sang-Hyeob Lee, Ho-Joon Ryoo and Jung-Joog Lee of the Seoul University, J. Vac. Sci. Technol., A 12(4), July–August 1994. In the introductory part of this article, the authors summarize the various known processes for forming $Ti_{1-x}Al_xN$ coatings such as above-mentioned and indicate the difficulties that exist due to the fact that TiN has a NaCl type structure while AlN crystallizes in an hexagonal structure of the wurtzite type. However, the authors tried to find a new CVD method and claimed to obtain $Ti_{1-x}Al_xN$ coatings by a plasma enhanced CVD method, using $TiCl_4$, $AlCl_3$, $NH_3$, $H_2$ and argon (forming the plasma) in an RF plasma or 15–200 watts. It would be emphasized that a plasma enhanced CVD deposition is not a simple operation and is not adapted to coat parts having complex shapes.

An object of the invention is to provide a method of CVD depositing $Ti_{1-x}Al_xN$ layers from simple precursors, and without a plasma enhancement.

SUMMARY OF THE INVENTION

To attain this object, the applicant observed that, if a suitable temperature range is selected, it is possible to use simple precursors comprising titanium chloride, aluminum chloride and ammonia, i.e. the same precursors as those suggested in the above-mentioned article but, that in this temperature range, it is not useful to operate in a plasma.

More particularly, the invention provides a method of forming a coating of $Ti_{1-x}Al_xN$ on a part, comprising the steps of heating a CVD chamber at a temperature of between 250 and 500° C.; arranging in this chamber the part to be coated, at a temperature of 550 to 650° C.; and injecting in the chamber a mixture of aluminum and titanium chlorides, $NH_3$ and $H_2$, the molar quantity of $NH_3$ being higher than the molar quantity of the chlorides and the molar quantity of hydrogen being higher than five times the molar quantity of the chlorides.

According to an embodiment of the invention, the pressure is in a range of $10^2$ to $10^5$ Pa.

According to an embodiment of the invention, the aluminum and titanium chlorides are $TiCl_4$ and $AlCl_3$.

According to an embodiment of the invention, the chlorides are obtained by injecting chlorine in an intermediate chamber adjacent to said chamber, and containing an aluminum-titanium alloy at a temperature of 650–750° C., the chlorine rate being selected so that no chlorine not combined with titanium and aluminum exists at the output of this intermediate chamber.

The invention also provides an apparatus of formation of a coating of $Ti_{1-x}Al_xN$ in a CVD enclosure, wherein the enclosure comprises a reaction chamber in which is arranged the part to be coated, at a temperature of 550–650° C.; an auxiliary chamber receiving chlorine and containing an aluminum-titanium alloy at a temperature of 650–750° C.; and a mixture chamber at a temperature of 250–550° C. receiving ammonia, hydrogen and possibly a carrier gas such as argon and the outflow from the auxiliary chamber.

BRIEF DESCRIPTION OF THE DRAWING

These objects, features, advantages and others of the invention will be described in more detail in the following description of a specific embodiment non-limitatively described in connection with FIG. 1 which shows an experimental mounting in which an example of implementation of the invention has been carried out.

DETAILED DESCRIPTION OF THE INVENTION

Figure 1:
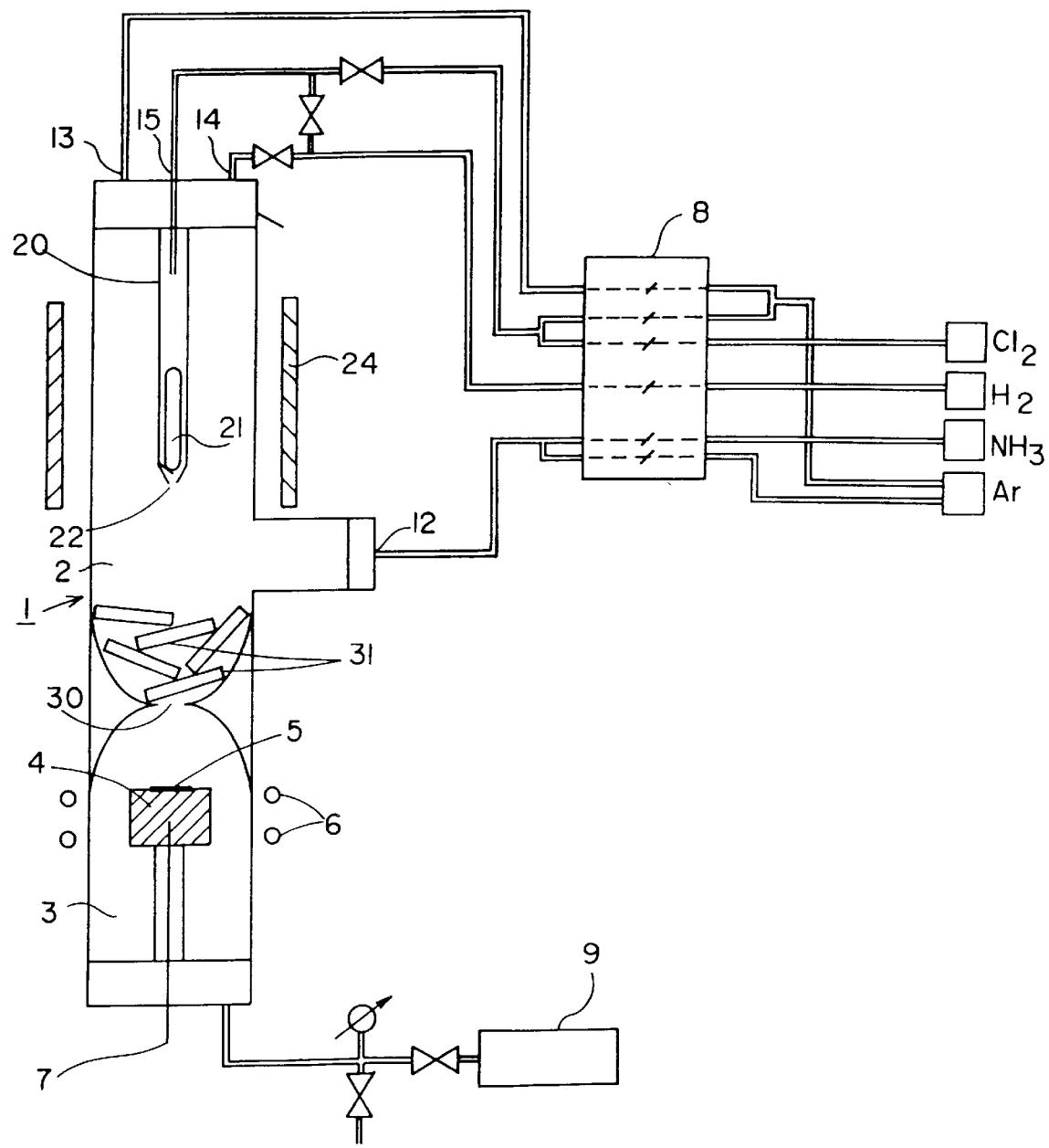

FIG. 1 represents a chemical vapor deposition (CVD) enclosure 1 comprising a mixture chamber 2 and a reaction chamber 3.

The reaction chamber 3 contains a support 4 on which is arranged a substrate 5 on which the coating is to be made. The support is heated at a temperature of 550–700° C., for example 650° C., by any suitable means, for example by induction heating originating from a winding 6. The temperature is monitored by a thermocouple 7.

The mixture chamber 2 receives various gases, the flows of which can be selectively adjusted by a regulation system 8 connected with sources of chlorine ($Cl_2$), hydrogen ($N_2$), ammonia ($NH_3$) and argon (Ar). The regulation system, associated with a vacuum pump 9 connected with the lower part of the reaction chamber, makes it possible to send on a first inlet 12 of chamber 2 a mixture of ammonia and argon (argon being optional), on a second inlet 13, eventually argon, and on a third inlet 14, hydrogen. A fourth input 15 of the mixture chamber 2 communicates with an auxiliary chamber 20 that contains an aluminum and titanium alloy 21, AlTi. This fourth input also receives chlorine, possibly added with argon. the chlorine flow is selected so that, at the output 22 of chamber 21, one obtains only aluminum and titanium chlorides and no non-combined chlorine. The alloy 21 contained in chamber 20 is heated at a temperature in the range of 650–750° C., by means of any suitable heating means, for example, a lamp oven 24.

Between the output 22 of the auxiliary chamber 20 and the communication 30 between the mixture chamber 2 and the reaction chamber 3, the gas flow and the surrounding atmosphere are selected so that the gas temperature remains between 250 and at most 500° C. Preferentially, baffles 31 are provided in the neighborhood of the opening 30, for example quartz bars, for providing an efficient mixture of the different gases injected in the mixture chamber (titanium and aluminum chlorides, $NH_3$, $H_2$ and possibly argon).

Ammonia is in a molar quantity clearly higher than the molar quantity of the chlorides exiting from the auxiliary chamber 20. Hydrogen is in a molar quantity at least five times higher, for example ten times, than the molar quantity of the chlorides.

In such conditions, a deposition of $Ti_{1-x}Al_xN$ was obtained with x comprised between 0.1 and 0.6. The fact that the obtained deposition corresponded to a single phase and not to a mixture of TiN and AlN grains was checked by X rays diffraction analysis and by electronic microscopy. The obtained film was, according to the deposition conditions, amorphous or single-crystallized.

Although one has presently no certain explanations on the reasons for which one unexpectedly obtained the above-indicated result, the inventors consider that this may result from the used alloy. Indeed, the chloridation has been obtained from a specific alloy of the Al—Ti system, in this precise case TiAl. However, other compounds could be used ($TiAl_2$, $TiAl_3$), separately or simultaneously, by pairs of neighboring phases in the phase diagram: $TiAl$-$TiAl_2$ or $TiAl_2$-$TiAl_3$, for example a buffer mixture with fixed activities for both elements. The use of TiAl presents the advantage of modulating the relative activities of aluminum and titanium and therefore provides the simultaneous formation with sufficient quantities of the two chloride types: the titanium chlorides and the aluminum chlorides. If a mixed load of Al and Ti was used, thermodynamic calculations indicate that the more stable chloride would be formed to the detriment of other chlorides, causing for example an excess of $AlCl_3$, $Al_2Cl_6$ to the detriment of $TiCl_3$ and $TiCl_4$. With TiAl, it will also be possible to modulate the proportions of the formed chlorides by modifying either the pressure or the temperature, or both.

In a specific example, one has used the following conditions:

duration of the deposition: 23 minutes,
temperature of the deposition: 600° C.,
temperature of the intermediate chamber: 750° C.,
total pressure: 113 kPa (10 torrs),
flows (sccm):
  $Cl_2$: 5,
  $NH_3$: 15,
  $H_2$: 90,
  Ar: 600,
Then, a deposition rate of about 50 nm per minute was obtained.

Additionally, the obtained results show that the invention can be generalized and that it is possible, without using a plasma to obtain CVD depositions from titanium chloride such as $TiCl_4$ and aluminum chloride such as $AlCl_3$ injected in a mixture chamber at a temperature in the range of 250–500° C. in the presence of an excess of ammonia and hydrogen. Experiments show that the total pressure in the chamber can be freely selected in a range of $10^2$ to $10^5$ pascals. Depositions at room pressure exhibit the drawback of a larger material consumption but the advantage of being easier to implement.

Of course, the invention is liable of various variants and modifications that will appear to those skilled in the art. In particular, for making depositions on parts having complex shapes, these parts will be directly arranged in the reaction chamber and heated, for example by induction, or by any other suitable means, for example in a heated wall oven. In the later case, the deposition will occur simultaneously on the parts and on the walls of the reaction chamber.

What is claimed is:

1. A method of forming a coating of $Ti_{1-x}Al_xN$ on a part without plasma enhancement, comprising the steps of:

heating a CVD chamber at a temperature of between 250 and 500° C.;

arranging in this chamber the part to be coated, at a temperature of 550 to 650° C.; and injecting in the chamber a mixture of aluminum and titanium chlorides, $NH_3$ and $H_2$, the molar quantity of $NH_3$ being higher than the molar quantity of the chlorides and the molar quantity of hydrogen being higher than five times the molar quantity of the chlorides.

2. The method of claim 1, wherein the pressure in the chamber is in a range of $10^2$ to $10^5$ Pa.

3. The method of claim 1, wherein the aluminum and titanium chlorides are $TiCl_4$ and $AlCl_4$.

4. The method of claim 1, wherein the chlorides are obtained by injecting chlorine at a predetermined rate in an intermediate chamber adjacent to said chamber, and containing an aluminum-titanium alloy at a temperature of 650–750° C., the chlorine injecting rate being selected so that no chlorine not combined with titanium and aluminum exists at the output of this intermediate chamber.

5. An apparatus of formation of a coating of $Ti_{1-x}Al_xN$ in a CVD enclosure without plasma formation, characterized in that said enclosure comprises:

a reaction chamber (3) in which is arranged a part to be coated, at a temperature of 550–650° C.;

an auxiliary chamber (20) receiving chlorine, said auxiliary chamber (20) containing an aluminum-titanium alloy at a temperature of 650–750°° C.; and a mixture chamber (2) at a temperature of 250–550° C. receiving ammonia, hydrogen and possibly a carrier gas such as argon and an outflow from the auxiliary chamber.

* * * * *